United States Patent
Abe et al.

(10) Patent No.: US 9,435,512 B2
(45) Date of Patent: Sep. 6, 2016

(54) LIGHTING APPARATUS

(71) Applicant: PANASONIC INTELLECTUAL PROPERTY MANAGEMENT CO., LTD., Osaka (JP)

(72) Inventors: Masumi Abe, Osaka (JP); Toshifumi Ogata, Osaka (JP); Atsuyoshi Ishimori, Osaka (JP); Kenji Sugiura, Osaka (JP); Yasufumi Wada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 227 days.

(21) Appl. No.: 14/508,140

(22) Filed: Oct. 7, 2014

(65) Prior Publication Data

US 2015/0098225 A1 Apr. 9, 2015

(30) Foreign Application Priority Data

Oct. 9, 2013 (JP) ................. 2013-212051

(51) Int. Cl.
*F21V 29/00* (2015.01)
*F21V 9/08* (2006.01)
*F21K 99/00* (2016.01)
*H01L 33/54* (2010.01)
*F21Y 101/02* (2006.01)
*F21Y 105/00* (2016.01)
*H05K 3/28* (2006.01)

(52) U.S. Cl.
CPC . *F21V 9/08* (2013.01); *F21K 9/50* (2013.01); *H01L 33/54* (2013.01); *F21Y 2101/02* (2013.01); *F21Y 2105/001* (2013.01); *H05K 3/284* (2013.01); *H05K 3/287* (2013.01); *H05K 2201/10106* (2013.01)

(58) Field of Classification Search
CPC .............. F21V 9/08; F21V 9/16; F21K 9/15; F21Y 2101/02; H01L 33/54; H01L 33/56; H05K 2201/10106; H05K 3/284; H05K 3/287
USPC ............................................... 362/27, 311.02
See application file for complete search history.

(56) References Cited

U.S. PATENT DOCUMENTS 8,058,662 B2    11/2011   Kim et al.

FOREIGN PATENT DOCUMENTS

JP     2008-544568      12/2008
WO    2007/004775       1/2007

OTHER PUBLICATIONS

U.S. Appl. No. 14/520,750 to Yamauchi et al., filed Oct. 22, 2014.

*Primary Examiner* — Ali Alavi
(74) *Attorney, Agent, or Firm* — Greenblum & Bernstein P.L.C.

(57) ABSTRACT

A lighting apparatus includes a substrate, a light-emitting element, and a sealing member. The light-emitting element emits light in a first wavelength range. The sealing member contains a material that converts the light in the first wavelength range to light in a second wavelength range different from the first wavelength range. The sealing member has a curved convex contour in at least one cross section that passes through the center of the light-emitting element and is perpendicular to a principal surface of the substrate. A curved line indicating a change in output angle that occurs upon a change in observation angle is approximated by a quadratic or trigonometric function that passes through the origin.

7 Claims, 16 Drawing Sheets

FIG. 5

| ANGLES (DEG.) | #1 OPTICAL PATH LENGTH RATIO | #1 INPUT ANGLE (DEG.) | #1 OUTPUT ANGLE (DEG.) | #2 OPTICAL PATH LENGTH RATIO | #2 INPUT ANGLE (DEG.) | #2 OUTPUT ANGLE (DEG.) | #3 OPTICAL PATH LENGTH RATIO | #3 INPUT ANGLE (DEG.) | #3 OUTPUT ANGLE (DEG.) | #4 OPTICAL PATH LENGTH RATIO | #4 INPUT ANGLE (DEG.) | #4 OUTPUT ANGLE (DEG.) | #5 OPTICAL PATH LENGTH RATIO | #5 INPUT ANGLE (DEG.) | #5 OUTPUT ANGLE (DEG.) |
|---|---|---|---|---|---|---|---|---|---|---|---|---|---|---|---|
| 90 | 1.37 | 41 | 67 | 1.49 | 27 | 39 | 1.23 | 7 | 10 | 1 | 0 | 0 | 0.81 | 8 | 12 |
| 80 | 1.37 | 17 | 25 | 1.35 | 12 | 17 | 1.20 | 0 | 0 | 1 | 6 | 10 | 0.77 | 1 | 2 |
| 70 | 1.22 | 12 | 17 | 1.25 | 6 | 8 | 1.20 | 5 | 7 | 1 | 10 | 14 | 3.32 | 6 | 8 |
| 60 | 1.09 | 8 | 12 | 1.18 | 6 | 8 | 1.19 | 2 | 3 | 1 | 15 | 21 | 2.29 | 11 | 15 |
| 50 | 0.94 | 7 | 10 | 1.08 | 7 | 10 | 1.13 | 4 | 6 | 1 | 13 | 19 | 1.69 | 9 | 13 |
| 40 | 0.82 | 5 | 7 | 0.94 | 5 | 7 | 1.04 | 11 | 16 | 1 | 5 | 5 | 1.37 | 8 | 11 |
| 30 | 0.89 | 3 | 4 | 0.98 | 7 | 10 | 0.98 | 9 | 13 | 1 | 0 | 0 | 1.19 | 6 | 8 |
| 20 | 0.96 | 2 | 3 | 0.99 | 6 | 9 | 1.00 | 5 | 7 | 1 | 1 | 0 | 1.07 | 4 | 6 |
| 10 | 0.99 | 1 | 2 | 1.00 | 4 | 5 | 1.01 | 3 | 4 | 1 | 7 | 10 | 1.02 | 2 | 3 |
| 0 | 1.00 | 0 | 0 | 1.00 | 0 | 0 | 1.00 | 0 | 0 | 1 | 0 | 0 | 1.00 | 0 | 0 |
| EVALUATION ON CHROMATIC DIFFERENCE | OK | | | - | | | NG | | | NG | | | NG | | |

LIGHTING APPARATUS

BACKGROUND OF THE INVENTION

1. Field of the Invention

The present disclosure relates to a lighting apparatus that uses a light-emitting element such as a light emitting diode (LED) and more particularly to a shape of a sealing member for sealing the LED.

2. Description of the Related Art

In recent years, lighting apparatuses using LEDs have been in widespread use. FIG. 15 is a cross-sectional view of a lighting apparatus disclosed by Japanese Translation of PCT Publication No. 2008-544568. Lighting apparatus 500 includes substrate 501, LED 502, sealing member 503, lead terminal 504, and sealing member 505. LED 502 is disposed on a principal surface of substrate 501. Sealing member 503 covers LED 502 and contains translucent resin 503a and phosphor 503b. Part of light emitted from LED 502 is extracted to outside after phosphor 503b converts a wavelength of the part of the light. Therefore, light emitted from lighting apparatus 500 contains a wavelength component of the light emitted from LED 502 and a wavelength component of light emitted from phosphor 503b. For example, by using a blue LED and a yellow phosphor, it is possible to produce white light that contains a wavelength component of blue light and a wavelength component of yellow light.

SUMMARY OF THE INVENTION

A lighting apparatus includes: a substrate having a principal surface; a light-emitting element disposed on the principal surface of the substrate; and a sealing member disposed on the principal surface of the substrate and covering the light-emitting element. The sealing member contains a material that converts a wavelength of light emitted from the light-emitting element. The sealing member has a contour in a shape of a curved convex in at least one cross section that passes through a center of the light-emitting element and is perpendicular to the principal surface of the substrate. A line that passes through the center of the light-emitting element and is perpendicular to the principal surface of the substrate is set as a reference line. A point of intersection of the reference line and the principal surface of the substrate is set as a reference point. A straight line that passes through the reference point and an arbitrary point on the contour of the sealing member is set as an arbitrary straight line. A normal to the contour of the sealing member at the arbitrary point on the contour is set as an arbitrary normal. An angle formed by the reference line and the arbitrary straight line is set as an observation angle. An angle formed by the arbitrary normal and the arbitrary straight line is set as an output angle. The output angle is represented by an approximate expression of a quadratic or trigonometric function of the observation angle that passes through an origin.

BRIEF DESCRIPTION OF DRAWINGS

FIG. 5 is a table indicating' an optical path length ratio, an input angle, an output angle, and evaluation on chromatic difference for each observation angle in each of the samples illustrated in FIG. 4A to FIG. 4E;

DETAILED DESCRIPTION OF THE PREFERRED EMBODIMENT

Figure 1:
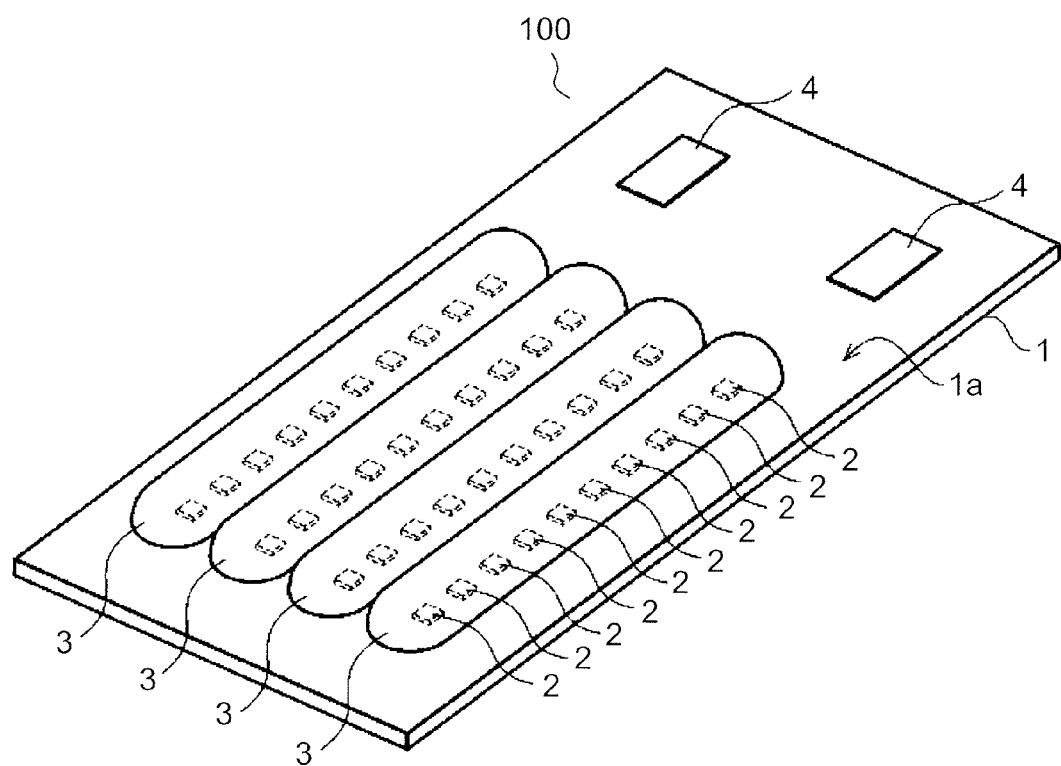
FIG. 1 is a perspective view illustrating a structure of a lighting apparatus according to a present embodiment.

A problem of a conventional lighting apparatus shall be described before a description of the present embodiment. With the conventional lighting apparatus, chromaticity of emitted light may vary depending on angles of the emitted light. A difference in chromaticity depending on output angles will cause color unevenness (a chromatic difference) of illumination light. For example, in the case where a blue LED and a yellow phosphor are used, light emitted in a direction perpendicular to the principal surface of substrate 501 (at an angle of zero degrees) has a white color while light emitted in a direction along the principal surface of substrate 501 (at an angle of 90 degrees) may have a white color that contains a large amount of a yellow component.

Hereinafter, the present embodiment is described with reference to the drawings. The subsequently-described embodiment shows a specific preferred example. Therefore, numerical values, shapes, materials, structural elements, arrangement and connection of the structural elements, steps (processes), an order of the steps, etc. shown in the following embodiment are mere examples.

It should be noted that the figures are schematic figures, and are not necessarily exact depictions. Moreover, in the figures, elements having substantially the same structure share the same reference numerals. Duplicate explanations of these elements are omitted or condensed.

An embodiment for implementing the present disclosure is described in detail with reference to the drawings.

<Overall Structure>

FIG. 1 is a perspective view illustrating a structure of lighting apparatus 100 according to the present embodiment.

Lighting apparatus 100 includes substrate 1, light-emitting element 2, sealing member 3, and power feed pad 4. A shape of substrate 1 viewed from above is rectangular. As substrate 1, a ceramic substrate, a glass epoxy substrate, or a metal substrate with an insulating film, for example, can be used.

Figure 2:
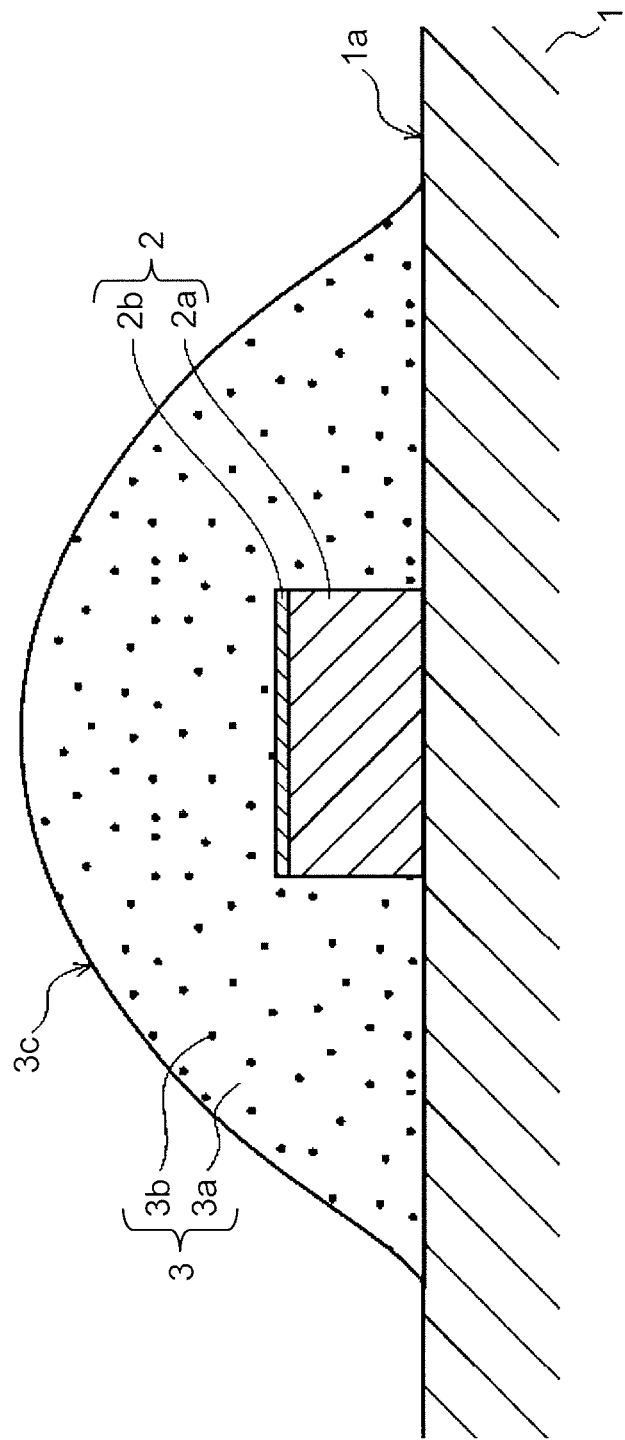
FIG. 2 is a cross-sectional view of the lighting apparatus of FIG. 1 cut along a plane perpendicular to a column direction of light-emitting elements.

Light-emitting element 2 is disposed on principal surface 1a of substrate 1. In the present embodiment, four columns in each of which 10 light-emitting elements 2 are arranged are provided in parallel with each other. As light-emitting element 2, an LED that emits light in a wavelength range of ultraviolet light or visible light, for example, can be used. In the present embodiment described herein, a GaN blue LED is used as light-emitting element 2. In FIG. 2, a cross section of lighting apparatus 100 cut perpendicularly to a column direction of light-emitting elements 2 is illustrated. This figure illustrates only one of the columns. Light-emitting element 2 includes substrate 2a and light-emitting layer 2b. In the case of a blue LED, substrate 2a is a sapphire substrate, and light-emitting layer 2b has a multi-layer structure including a positive electrode, a semiconductor layer, and a negative electrode. As a material of the semiconductor layer, GaN is used.

Sealing member 3 is disposed on principal surface 1a of substrate 1 and covers light-emitting elements 2 in common on a per column basis. As illustrated in FIG. 2, sealing member 3 contains translucent material 3a and wavelength converting material 3b. Wavelength converting material 3b converts a wavelength of light emitted from light-emitting element 2 and is evenly dispersed in sealing member 3.

As translucent material 3a, silicone resin, epoxy resin, fluorine resin, urea resin, or silicone-epoxy hybrid resin, for example, can be used. As wavelength converting material 3b, a phosphor, for example, can be used. In the present embodiment described herein, a yellow phosphor is used as wavelength converting material 3b. As the yellow phosphor, $(Y, Gd)_3Al_5O_{12}:Ce^{3+}$, $Y_3Al_5O_{12}:Ce^{3+}$, $Pr^{3+}$, $(Tb, Gd)_3Al_5O_{12}:Ce^{3+}$, $(Sr, Ba)_2SiO_4:Eu^{2+}$, $(Sr, Ca)_2SiO_4:Eu^{2+}$, $CaSi_2O_2N_2:Eu^{2+}$, $Ca\text{-}\alpha\text{-}SiAlON:Eu^{2+}$, $Y_2Si_4N_6C:Ce^{3+}$, or $CaGa_2S_4:Eu^{2+}$, for example, can be used.

In lighting apparatus 100, a blue LED is used as light-emitting element 2, and a yellow phosphor is used as wavelength converting material 3b. With this, part of light emitted from light-emitting element 2 exits to outside after wavelength converting material 3b converts a wavelength of the part of the light. Therefore, light emitted from lighting apparatus 100 is white light that contains a blue wavelength component of the light emitted from light-emitting element 2 and a yellow wavelength component of light emitted from wavelength converting material 3b.

Furthermore, sealing member 3 can be formed in the dispensing or resin molding process, for example. In the dispensing process, an uncured sealing material is applied in lines to substrate 1 through a nozzle that moves above substrate 1, and the applied sealing material is then cured. In the resin molding process, a mold is placed over substrate 1, an uncured sealing material is injected into a hollow space between the mold and substrate 1, and the injected sealing material is then cured. As illustrated in FIG. 2, surface 3c of sealing member 3 has a contour in a shape of a curved convex. Surface 3c can be adjusted in shape by viscosity of the uncured sealing material in the dispensing process and by a shape of the mold in the resin molding process.

It should be noted that although lighting apparatus 100 uses a yellow phosphor as wavelength converting material 3b, this is not the only example. For example, a mixture of a green phosphor and a red phosphor or a mixture of a yellow phosphor and a red phosphor may be used as wavelength converting material 3b. Furthermore, sealing member 3 may contain a light-scattering material for scattering light.

Power feed pad 4 is disposed on principal surface 1a of substrate 1 and is electrically connected to light-emitting element 2 by a patterned wire (not illustrated). Light-emitting element 2 can be supplied with electricity from outside by way of power feed pad 4.

<Shape of Sealing Member>

Next, a shape of sealing member 3 in lighting apparatus 100 is described in detail.

Figure 3A:
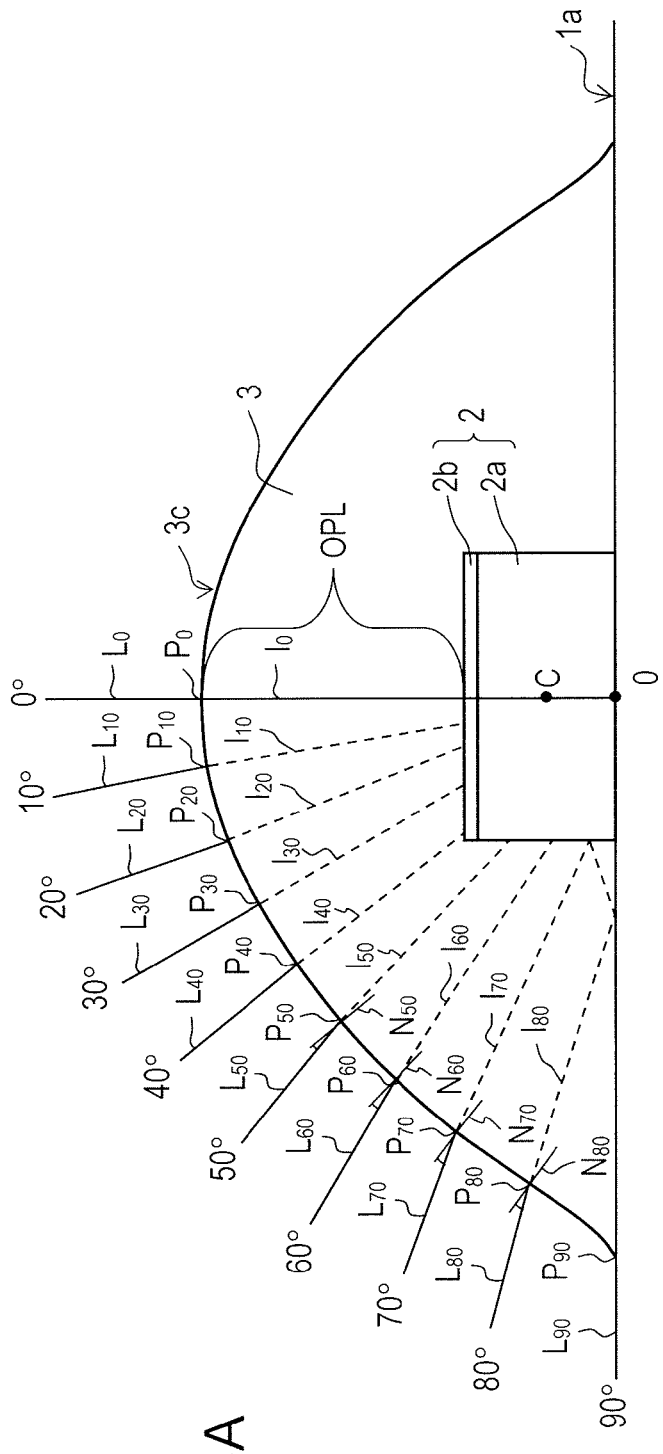
FIG. 3A is an illustration of a cross section in FIG. 2 with an auxiliary line added for explaining a shape of a sealing member.
Figure 3B:
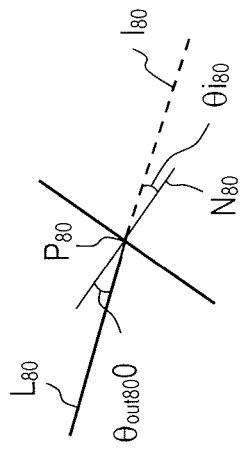
FIG. 3B is an enlarged view of part of FIG. 3A.
Figure 4C:
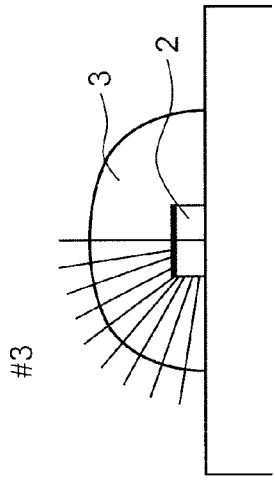
FIG. 4C illustrates a shape of a cross section including light-emitting element sample #3.
Figure 4B:
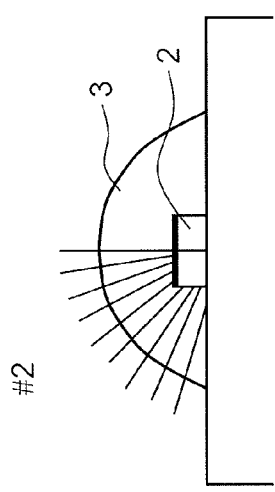
FIG. 4B illustrates a shape of a cross section including light-emitting element sample #2.
Figure 4E:
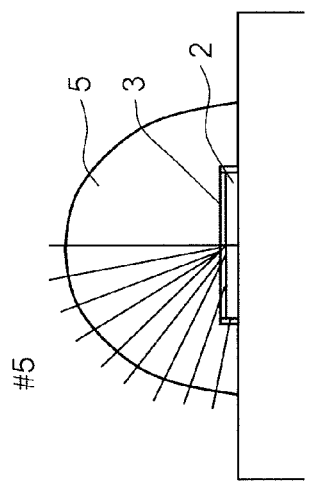
FIG. 4E illustrates a shape of a cross section including light-emitting element sample #5.
Figure 4A:
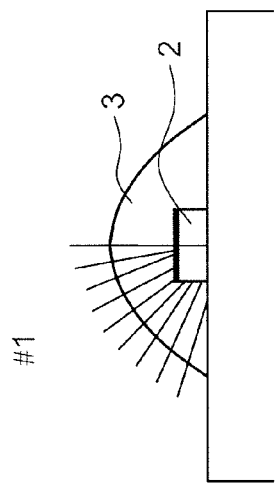
FIG. 4A illustrates a shape of a cross section including light-emitting element sample #1.
Figure 4D:
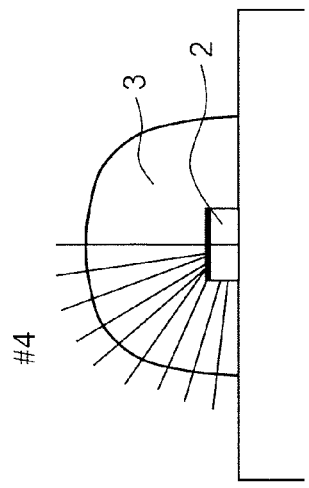
FIG. 4D illustrates a shape of a cross section including light-emitting element sample #4.

FIG. 3A is an illustration of a cross section in FIG. 2 with an auxiliary line added for explaining a shape of the sealing member, and FIG. 3B is an enlarged view of part of FIG. 3A.

Here, straight line L0 which passes through center C of light-emitting element 2 and is perpendicular to principal surface 1a is set as a reference line, and a point of intersection of the reference line and principal surface 1a is set as reference point O.

Straight lines $L_0$ to $L_{90}$ pass through reference point O and form respective angles zero degrees to 90 degrees with straight line $L_0$ (each hereinafter referred to as "observation angle"). For example, straight line $L_{80}$ has an observation angle of 80 degrees. Straight line $L_{80}$ represents light emitted from sealing member 3 to outside in a direction at the observation angle of 80 degrees.

Points $P_0$ to $P_{90}$ are on the contour of surface 3c of sealing member 3 and are respective points of intersection of straight lines $L_0$ to $L_{90}$ and a contour line of surface 3c of sealing member 3. For example, point $P_{80}$ is a point of intersection of straight line $L_{80}$ and the contour line of surface 3c of sealing member 3. Point $P_{80}$ indicates a light-emitting position which is on surface 3c of sealing member 3 and from which light exits in the direction at the observation angle of 80 degrees.

Straight line $N_{80}$ is a normal to the contour of surface 3c of sealing member 3 at point $P_{80}$. Likewise, straight lines $N_{50}$ to $N_{70}$ are respective normals to the contour of surface 3c of sealing member 3 at points $P_{50}$ to $P_{70}$. Although only straight lines $N_{50}$ to $N_{80}$ are illustrated in FIG. 3A, normals are also present likewise at point $P_0$ to point $P_{40}$.

Dashed line $I_{80}$ indicates an optical path inside sealing member 3 that is assumed to have been taken by light exiting from point $P_{80}$ along straight line $L_{80}$. This applies to dashed lines $I_{10}$ to $I_{70}$ likewise. An angle between normal $N_{80}$ and straight line $L_{80}$ is output angle $\theta_{out80}$. An angle between normal $N_{80}$ and dashed line $I_{80}$ is input angle $\theta_{i80}$. Snell's law holds between output angle $\theta_{out80}$ and output angle $\theta_{out}$ illustrated in FIG. 3B. Thus, it is possible to determine input angle $\theta_{i80}$ from output angle $\theta_{out80}$. This applies to other cases with output angles $\theta_{out10}$ to $\theta_{out70}$.

In the present embodiment, surface 3c of sealing member 3 forms such a shape that the output angle increases as the observation angle increases. In detail, it is defined so as to satisfy at least one of the following conditions (1) and (2). With this, the chromatic difference depending on angles of emitted light can be reduced.

(1) The output angle is approximated by a quadratic function of the observation angle. For example, a set of an observation angle and an output angle is determined for each of points $P_0$ to $P_{90}$ on surface $3c$ of sealing member 3. Here, the set of an observation angle and an output angle can be plotted on an xy-plane where an x-axis represents an observation angle and a y-axis represents an output angle. A curved line connecting these points $P_0$ to $P_{90}$ can be approximated by a quadratic function. The quadratic function can be converted into an expansion of a trigonometric function.

(2) When a line that passes through center C of light-emitting element 2 and is perpendicular to the principal surface of the substrate (straight line $L_0$) is set as a y-axis, and a line that passes through reference point O and extends along the principal surface of the substrate (straight line $L_{90}$) is set as an x-axis, a curved line obtained by projecting the contour of surface $3c$ of sealing member 3 onto an xy-plane is approximated by a function including a trigonometric function.

<Evaluation>

Using samples #1 to #5 in each of which sealing member 3 has a different shape, chromaticity of light emitted in a direction perpendicular to principal surface $1a$ of each of the samples (hereinafter referred to as "light at the observation angle of zero degrees") and chromaticity of light emitted in a direction along principal surface $1a$ of each of the samples (hereinafter referred to as "light at the observation angle of 90 degrees) are measured. Using these measurement values, a difference between the chromaticity of light at the observation angle of zero degrees and the chromaticity of light at the observation angle of 90 degrees (hereinafter referred to simply as "chromatic difference") is determined for each of the samples. Evaluation is then made on whether or not the chromatic difference is smaller than a reference, i.e., the chromatic difference of a reference sample. With a smaller chromatic difference than that of the reference sample, the chromatic difference depending on angles of emitted light can be reduced as compared to a conventional case.

FIG. 4A to FIG. 4E illustrate respective shapes of cross sections including light-emitting elements 2 of samples of five types. FIG. 5 indicates results of various measurements of each of the samples. Samples #1 to #4 are prototypes, and sample #5 is a marketed product.

Sealing member 3 in sample #1 has the same shape as sealing member 3 illustrated in FIG. 2. Sample #2 is the reference sample which serves as a criterion for evaluation on the chromatic difference.

Sealing members 3 in samples #3 and #4 each have a shape in which an optical path length ratio in a range of large observation angles (e.g., 70 degrees to 80 degrees) is smaller than that of sample #2. The optical path length ratio indicates a normalized value of a length of an optical path inside sealing member 3 that is assumed to have been taken by light at each of the observation angles, with respect to a length of an optical path inside sealing member 3 that is assumed to have been taken by light at the observation angle of zero degrees (OPL in FIG. 3). Generally, the greater the optical path length inside sealing member 3 is, the higher the probability that a wavelength will be converted inside sealing member 3 is. Accordingly, in the case where a blue LED and a yellow phosphor are used in combination, it is conceivable that the greater the optical path length inside sealing member 3 is, the more the yellow component is in color components of light emitted from sealing member 3.

The optical path length ratio of each of samples #3 and #4 is less than the optical path length ratio of sample #2 (the reference sample) in the range of large observation angles.

The cross section of sealing member 3 in sample #5 is in a shape of uniform thickness instead of being in a shape of a curved convex. Sealing member 3 containing a wavelength converting material covers only a surface of light-emitting element 2. In sample #5, light-emitting element 2 and sealing member 3 are further covered with sealing member 5 containing no wavelength converting material. An optical path length ratio of sample #5 is determined from only an optical path inside sealing member 3. No optical path inside sealing member 5 is taken into consideration.

Figure 6:
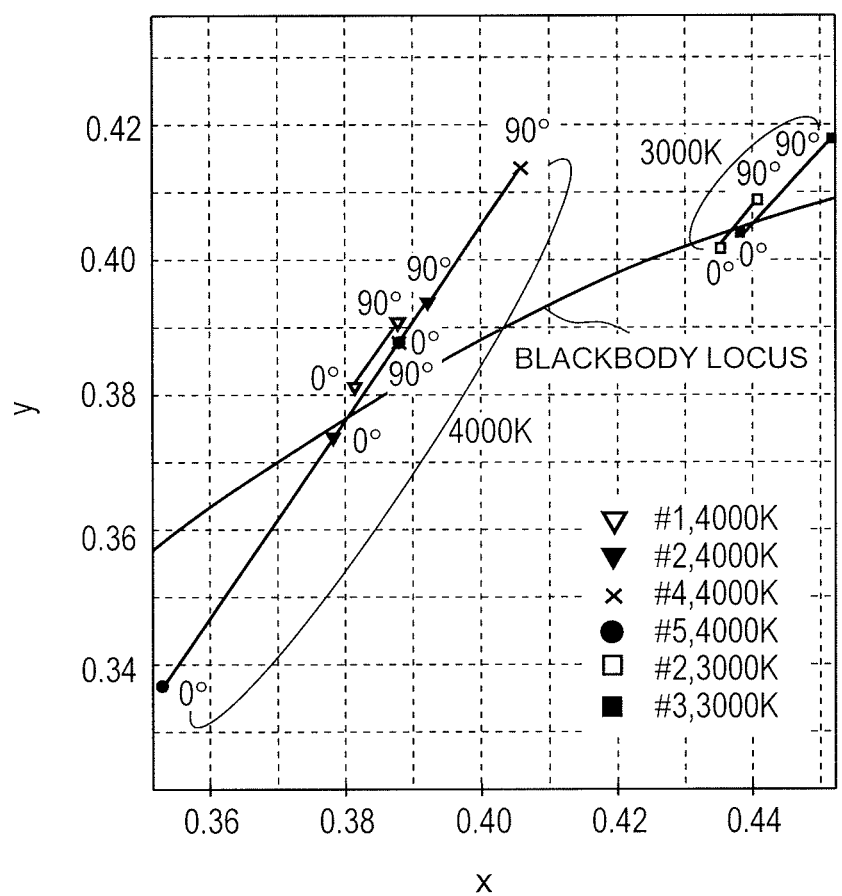
FIG. 6 is a chromaticity diagram plotting chromaticity of light at the observation angle of zero degrees and chromaticity of light at the observation angle of 90 degrees in each of the samples illustrated in FIG. 4A to FIG. 4E.

FIG. 6 is a chromaticity diagram plotting chromaticity of light at the observation angle of zero degrees and chromaticity of light at the observation angle of 90 degrees in each of the samples of five types. The shorter the distance between points of the chromaticity of light at both observation angles in the chromaticity diagram is, the smaller the chromatic difference is. In short, this shows that the chromatic difference depending on the observation angles is small. Two types of sample #2 that have correlated color temperatures of 3,000 K and 4,000 K are used.

With reference to and around 4,000 K, the chromatic difference of sample #1 is smaller than the chromatic difference of sample #2. Sample #1 allows the chromatic difference depending on output angles to be reduced as compared to sample #2. Here, the chromatic difference of sample #1 is less than the 4-step MacAdam ellipse. Meanwhile, the chromatic difference of each of samples #4 and #5 is larger than the chromatic difference of sample #2 (the reference sample). With reference to and round 3,000 K, the chromatic difference of sample #3 is larger than the chromatic difference of sample #2 (the reference sample).

Since the optical path length ratio of each of samples #3 and #4 is smaller than the optical path length ratio of sample #2 (the reference sample), the chromatic difference of each of samples #3 and #4 is expected to be smaller than the chromatic difference of sample #2. However, the chromatic difference of each of samples #3 and #4 is greater than the chromatic difference of sample #2. This result would show that an increase of the yellow component in color components of light in the range of large observation angles is not simply due to the optical path length ratio only. FIG. 5 indicates, in a column at the bottom, a result of the evaluation conducted on the chromatic difference of each of the samples other than sample #2 in comparison with sample #2. Only sample #1 allows the chromatic difference to be reduced as compared to sample #2 (the reference sample).

<Analysis>

Figure 7A:
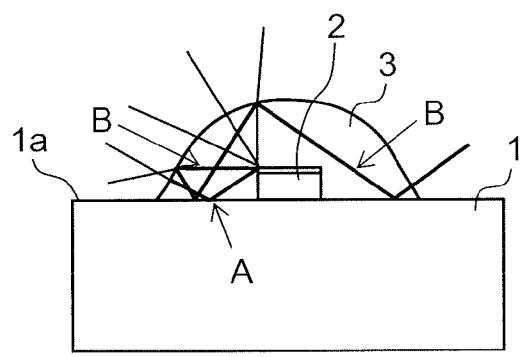
FIG. 7A is an illustration for analyzing cause of occurrence of a chromatic difference in sample #2.
Figure 7B:
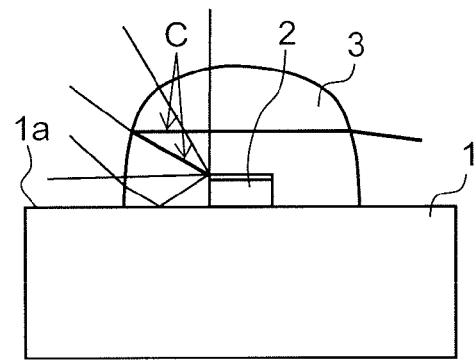
FIG. 7B is an illustration for analyzing cause of occurrence of a chromatic difference in sample #4.

FIG. 7A and FIG. 7B are views for analyzing cause of occurrence of the chromatic difference.

In sample #2 illustrated in FIG. 7A, sealing member 3 is smaller in height than in width. For example, light A (light at 120 degrees from a direction perpendicular to substrate 1) is reflected off principal surface $1a$ of substrate 1 and exits from a side surface of sealing member 3 (in the range of large observation angles). In this case, the optical path length is great. Furthermore, light B (light at 90 degrees from the direction perpendicular to substrate 1) is reflected off an interface between sealing member 3 and air and principal surface $1a$ of substrate 1 and exits from the side surface of sealing member 3. In this case, the optical path length is especially great because of multiple reflections of light B inside sealing member 3. It is conceivable that when the light reflected off the interface between sealing member 3 and the air and the principal surface of substrate 1 exits from the side surface of sealing member 3 as above, the emitted light contains an increased amount of the yellow component.

Figure 8:
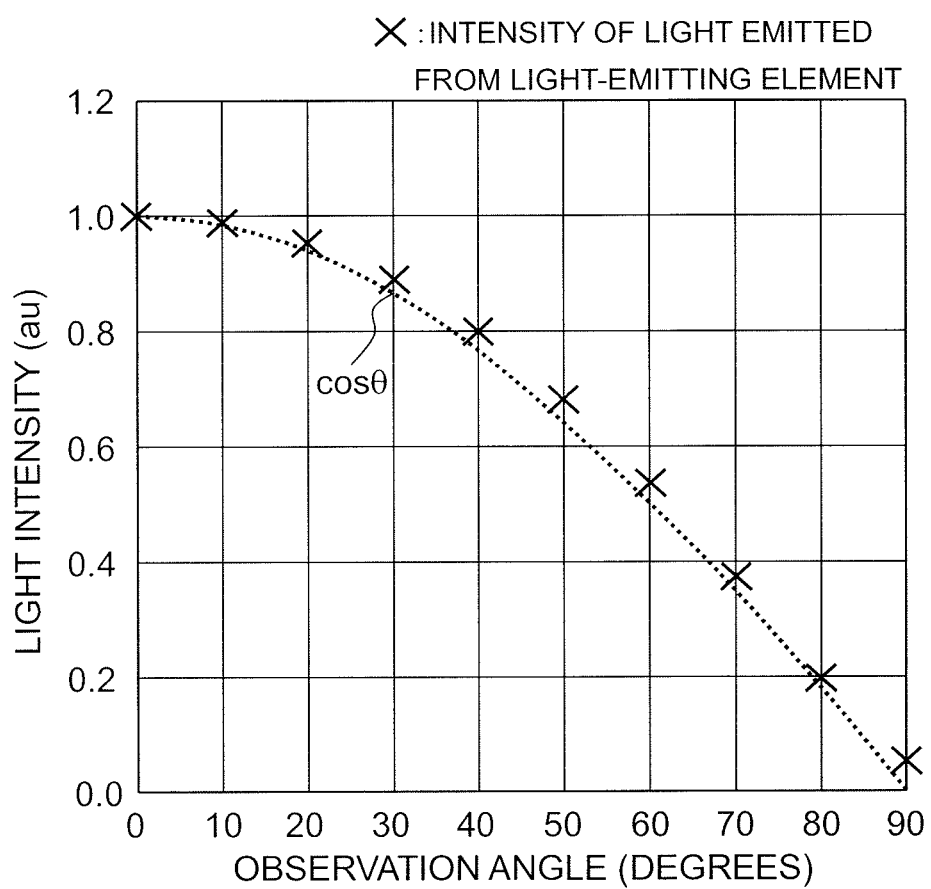
FIG. 8 is a graph representing a relationship between an exit direction and intensity of light from a light-emitting element.

In sample #4 illustrated in FIG. 7B, sealing member 3 is greater in height than in width. For example, light C (light at 60 degrees from the direction perpendicular to substrate 1) is reflected off an interface between sealing member 3 and the air and exits from a side surface of sealing member 3. Also in this case, the optical path length is great. FIG. 8 represents a relationship between an exit direction and intensity of light from light-emitting element 2. FIG. 8 indicates that distribution of the intensity of light emitted from light-emitting element 2 is the Lambertian distribution. Accordingly, intensity of light C is about half intensity of the light traveling in the direction perpendicular to substrate 1, which is relatively high. Thus, light C is great in optical path length and moreover in intensity, so that the yellow component therein is conspicuous. This would be one of the reasons why the chromatic difference of each of samples #3 and #4 is not smaller than that of sample #1.

Based on the foregoing, it would be important to minimize the occurrence of light having relatively high intensity being reflected off the interface between sealing member 3 and the air, in order to reduce the chromatic difference.

Figure 9:
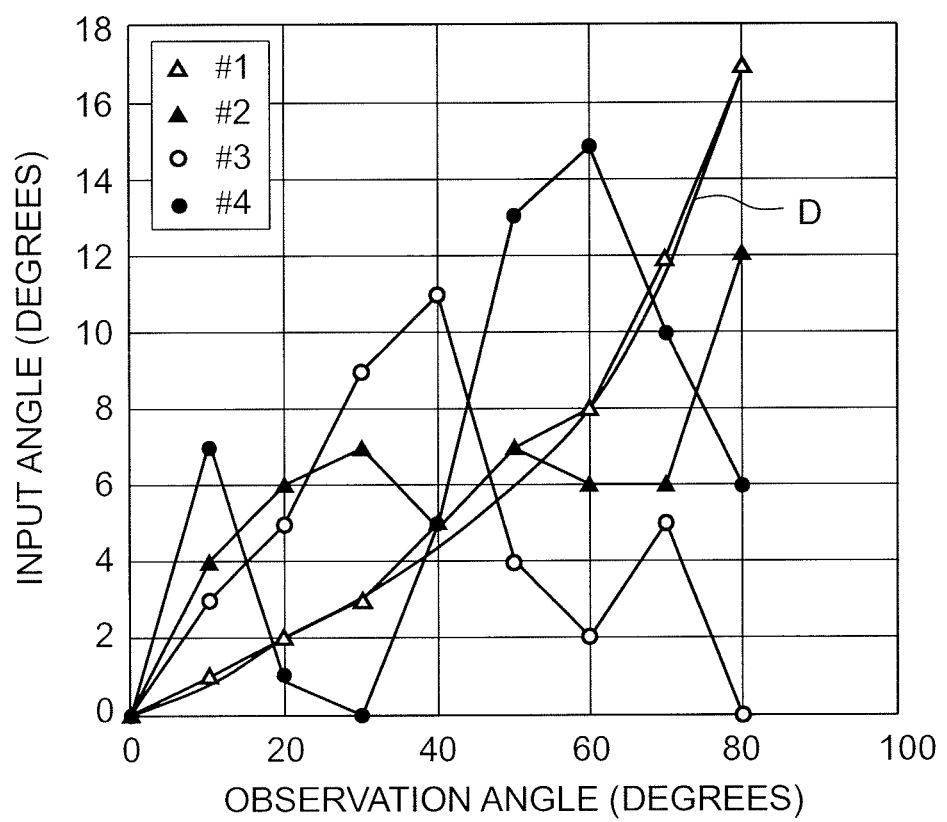
FIG. 9 is a graph plotting a relationship between the observation angle and the input angle of FIG. 5.
Figure 10:
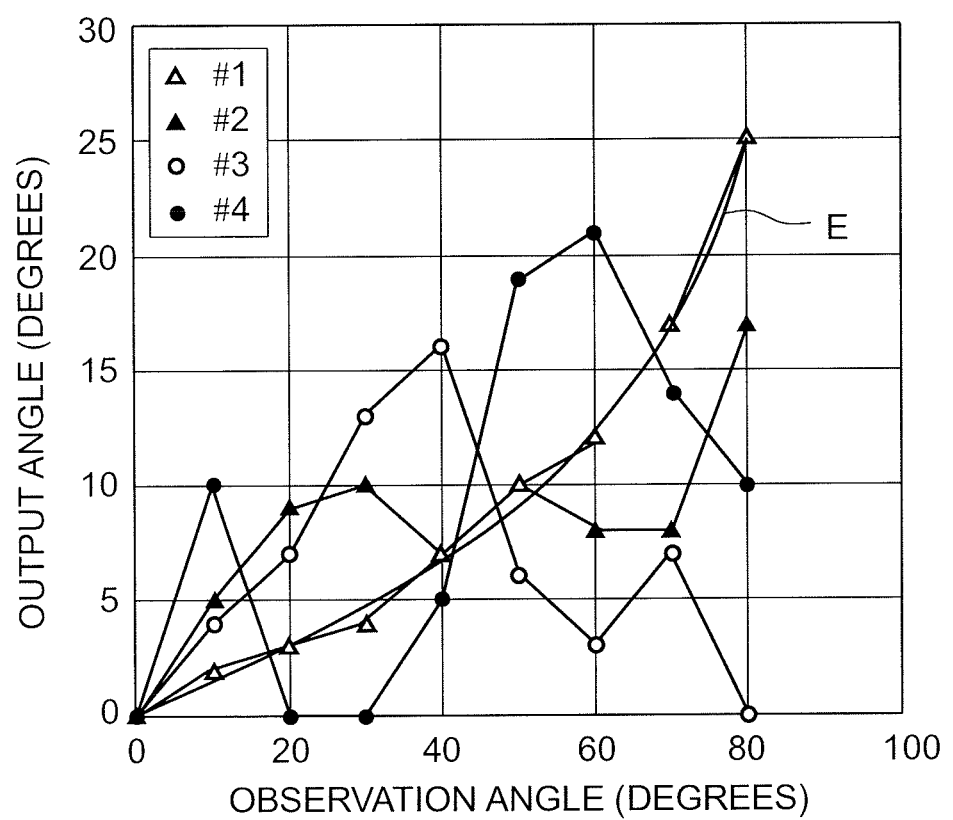
FIG. 10 is a graph plotting a relationship between the observation angle and the output angle of FIG. 5.

FIG. 9 and FIG. 10 are graphs plotting a relationship between the observation angle and the input angle of each of samples #1 to #5 indicated in FIG. 5 and a relationship between the observation angle and the output angle of each of samples #1 to #5 indicated in FIG. 5. The input angle is determined from the output angle using the Snell's law. The derivation of the input angle uses a refractive index of dimethyl silicone resin, i.e., a material of sealing member 3, which is 1.41.

In sealing member 3 in sample #1, the greater the observation angle is, the greater the input angle and the output angle are. Specifically, in curve D representing the relationship between the observation angle and the input angle and curve E representing the relationship between the observation angle and the output angle, the input angle and the output angle are approximated by respective quadratic functions, Expression (1) and Expression (2), of the observation angle that pass through an origin.

$$\theta_{in}=0.0021\theta_{obs}^2+0.03070\theta_{obs} \quad \text{Expression (1)}$$

$$\theta_{out}=0.0032\theta_{obs}^2+0.03870\theta_{obs} \quad \text{Expression (2)}$$

A correlation coefficient of Expression (1) and a correlation coefficient of Expression (2) are 0.9834 and 0.9811, respectively. Units of measure for these are degrees. It should be noted that either of these expressions can be replaced with a trigonometric function for approximation by way of a Taylor expansion.

In contrast, there is no such relationship in samples #2 to #4.

Figure 11:
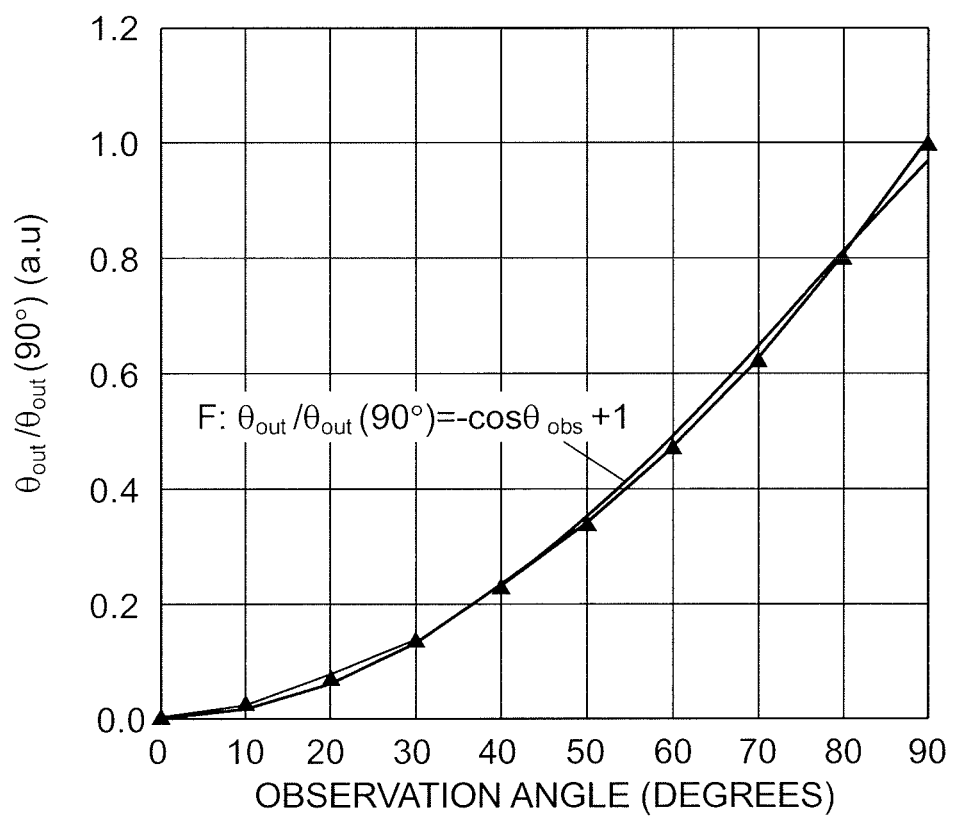
FIG. 11 is a graph representing a normalized relationship between the observation angle and the output angle in sample #1 of FIG. 5.

FIG. 11 is a graph obtained by normalizing approximate line E of FIG. 10 with respect to output angle $\theta_{out}(90°)$ which is obtained when the observation angle is 90 degrees. Approximate line F is represented by a trigonometric function, Expression (3), where the output angle is denoted by $\theta_{out}$ and the observation angle is denoted by $\theta_{obs}$.

$$\theta_{out}/\theta_{out}(90°)=-\cos\theta_{obs}+1 \quad \text{Expression (3)}$$

If a range of approximation of Expression (3) is set as a 95% confidence interval, a lower limit is represented by $$\theta_{out}=-1.03\cos\theta_{obs}+0.97 \quad \text{Expression (4A),}$$

and an upper limit is represented by $$\theta_{out}=-0.97\cos\theta_{obs}+1.03 \quad \text{Expression (4B).}$$

Thus, in sealing member 3 in sample #1, the greater the observation angle is, the greater the input angle and the output angle are. In other words, the input angle and the output angle are small in a range of small observation angles which is a range in which the intensity of emitted light is relatively high. Therefore, it is possible to minimize the occurrence of light having relatively high intensity being reflected off the interface between sealing member 3 and the air. Consequently, the chromatic difference depending on angles of emitted light can be reduced.

Figure 12A:
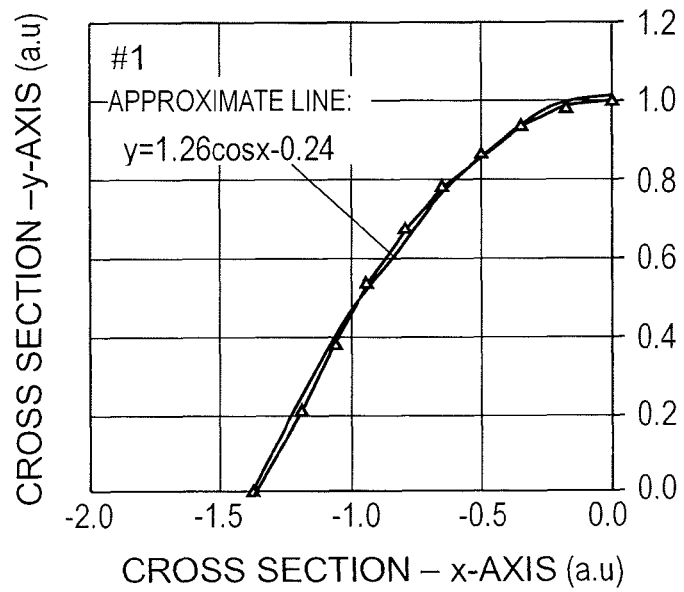
FIG. 12A to FIG. 12D are graphs plotting, on xy-planes, respective contours of the cross sections of sealing members of FIG. 4A to FIG. 4D.
Figure 12B:
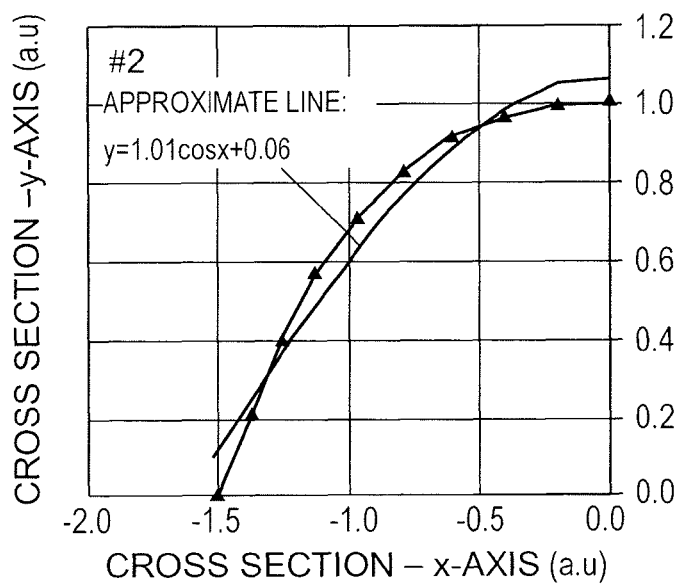
Figure 12C:
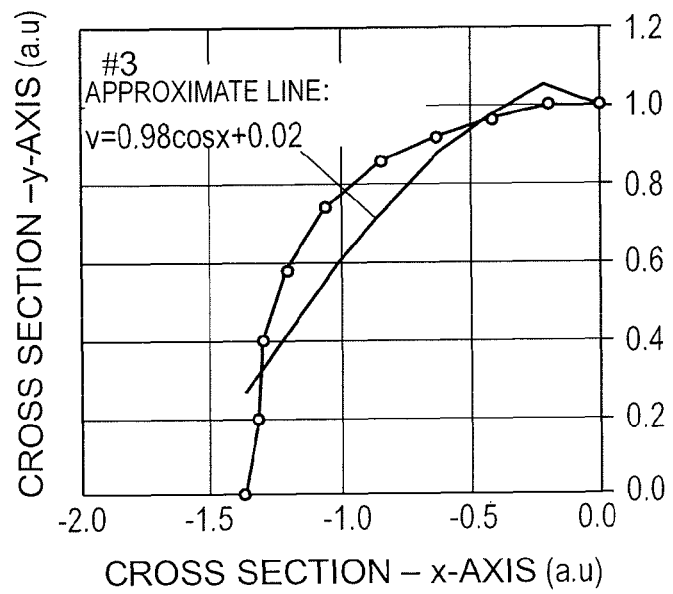
Figure 12D:
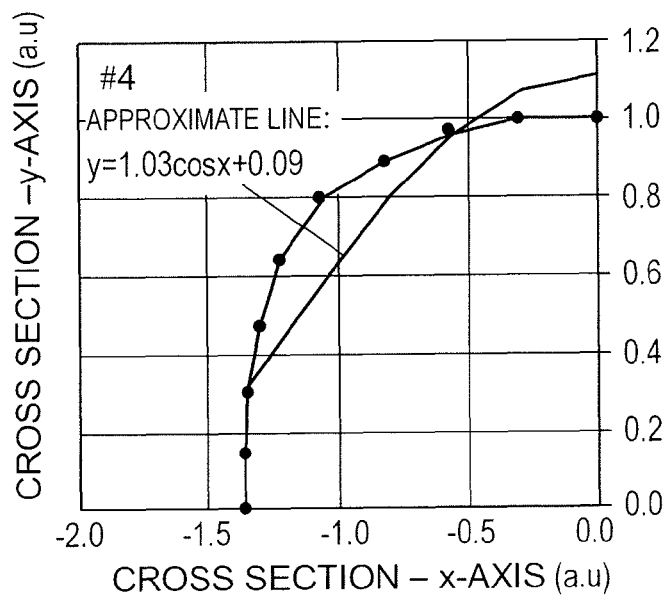

FIG. 12A to FIG. 12D are graphs plotting, on xy-planes, respective contours of the cross sections of sealing members 3 in samples #1 to #5. These figures include normalization with respect to a topmost height of sealing member 3. Specifically, the normalization has been applied such that a point on the contour of sealing member 3 in the cross section that is at zero on the x-axis falls on 1 on the y-axis. As indicated in FIG. 12A, the contour of sealing member 3 in sample #1 is approximated by a function including a trigonometric function.

$$y=1.26\cos x-0.24 \quad \text{Expression (5)}$$

In contrast, the contour of sealing member 3 in each of samples #2 to #4 cannot be approximated by a function including a trigonometric function.

If a range of approximation of Expression (5) is set as a 95% confidence interval, a lower limit is represented by $$y=1.20\cos x-0.28 \quad \text{Expression (6A),}$$

and an upper limit is represented by $$y=1.31\cos x-0.20 \quad \text{Expression (6B).}$$

Thus, the contour of sealing member 3 in sample #1 is approximated by the function including the trigonometric function, with the result that a slope of a tangent line of the contour is also represented by a function including a trigonometric function. In addition, in sample #1, the tangent line has a small slope in the range of small observation angles which is a range in which the intensity of light is relatively high. Accordingly, the input angle of light is small. Therefore, it is possible to minimize the occurrence of light having relatively high intensity being reflected off the interface between the sealing member and the air. Consequently, the chromatic difference depending on angles of emitted light can be reduced.

CONCLUSION

As described above, the lighting apparatus according to the present embodiment includes substrate 1, light-emitting element 2, and sealing member 3. Substrate 1 has principal surface 1a. Light-emitting element 2 is disposed on principal surface 1a of substrate 1 and emits light in a first wavelength range. Sealing member 3 is disposed on principal surface 1a of substrate 1, covers light-emitting element 2, and contains wavelength converting material 3b which converts light in the first wavelength range into light in a second wavelength range different from the first wavelength range. Sealing member 3 has a contour in a shape of a curved convex in at least one cross section that passes through center C of light-emitting element 2 and is perpendicular to principal surface 1a of substrate 1. With this, a curved line indicating a change in output angle that occurs upon a change in observation angle is approximated by a function including a trigonometric function. Consequently, the chromatic difference depending on angles of emitted light can be reduced.

Here, the line that passes through center C of light-emitting element 2 and is perpendicular to principal surface 1a of substrate 1 is set as a reference line. The point of intersection of the reference line and principal surface 1a of substrate 1 is set as reference point O. The straight lines that pass through reference point O and respective arbitrary points on the contour of sealing member 3 and reference point O are set as arbitrary straight lines $L_0$ to $L_{90}$. The normals to the contour of sealing member 3 at arbitrary points $P_0$ to $P_{90}$ on the contour are set as arbitrary normals $N_0$ to $N_{90}$. The angles formed by the reference line and the arbitrary straight lines are set as the observation angles. The angles formed by the arbitrary normals and the arbitrary straight lines are set as the output angles.

Furthermore, the curved line obtained by projecting the contour of sealing member 3 onto the xy-plane is approximated by the function including the trigonometric function. Also with this, the chromatic difference depending on angles of emitted light can be reduced.

Here, the line that passes through center C of light-emitting element 2 and is perpendicular to principal surface 1a of substrate 1 is set as the y-axis. The point of intersection of the y-axis and the principal surface of the substrate is set as reference point O. The line that passes through reference point O and extends along principal surface 1a of substrate 1 is set as the x-axis.

VARIATION

Although the lighting apparatus according to the present invention has been described based on the embodiment, the present invention is not limited to such embodiment. For example, variations indicated below are possible.

Figure 13:
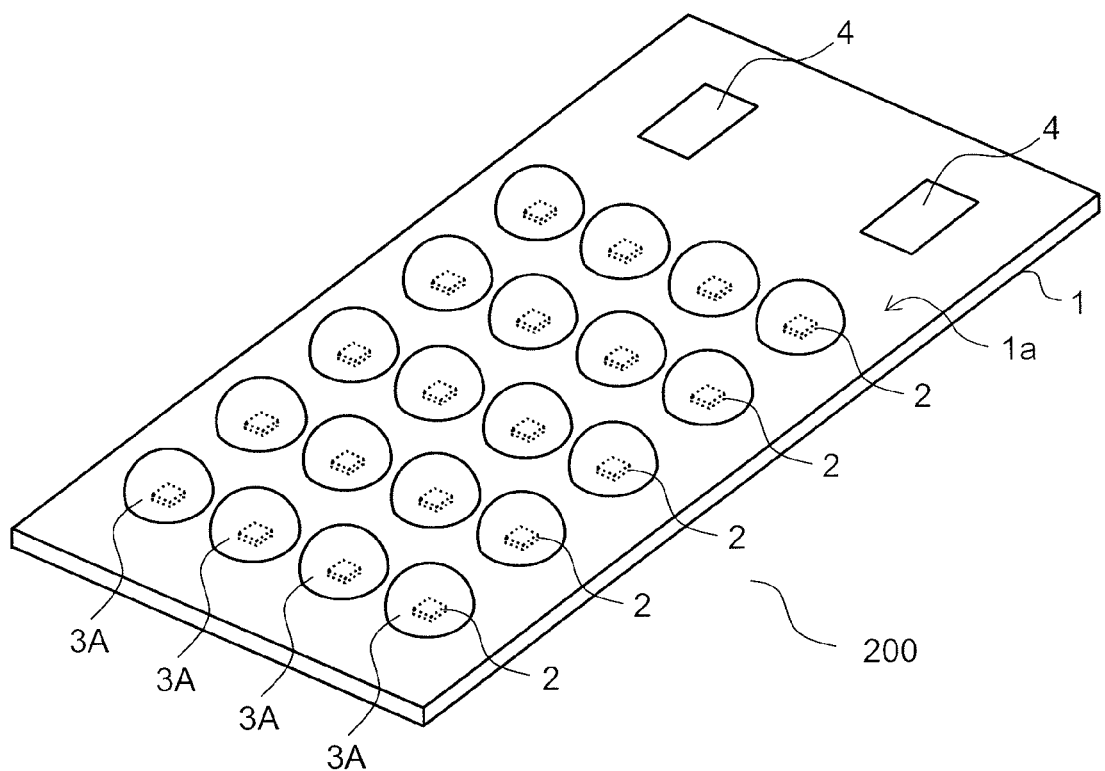
FIG. 13 is a perspective view illustrating a structure of a lighting apparatus according to a variation.
Figure 14:
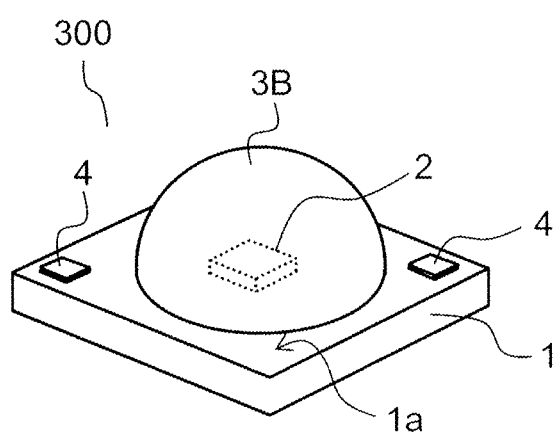
FIG. 14 is a perspective view illustrating a structure of a lighting apparatus according to another variation.
Figure 15:
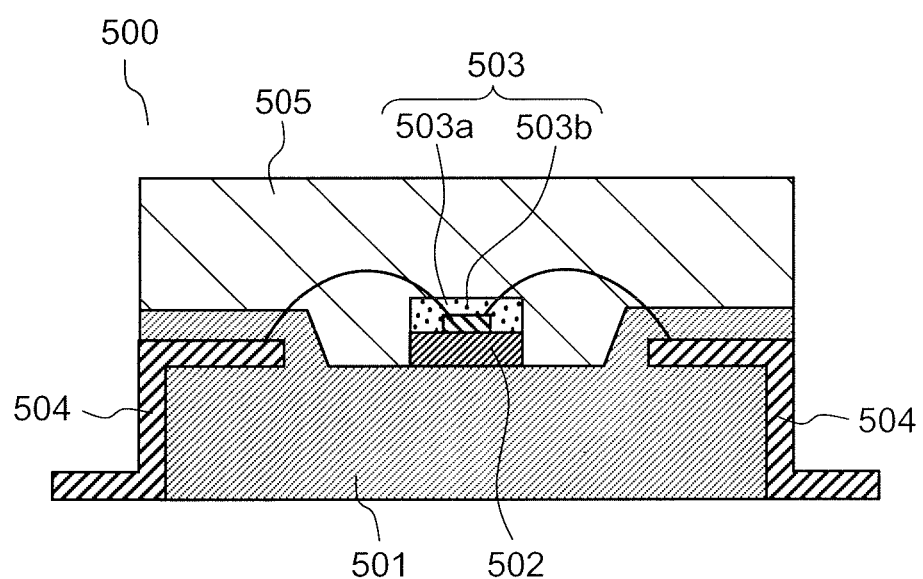
FIG. 15 is a cross-sectional view of a conventional lighting apparatus.

FIG. 13 and FIG. 14 are perspective views illustrating structures of lighting apparatus 1 according to the variations. In lighting apparatus 200 illustrated in FIG. 13, sealing member 3A seals light-emitting element 2 on a one-to-one basis. Sealing member 3A has a structure in rotational symmetry whose central axis is a line that passes through center C of light-emitting element 2 and is perpendicular to principal surface 1a of substrate 1 (a reference line). This means that a shape of sealing member 3A when viewed in a cross section that passes through the central axis is the same as the shape of the cross section of sealing member 3 illustrated in FIG. 3A. The other structures are the same or alike as those of lighting apparatus 1. With sealing member 3A having the structure in rotational symmetry whose central axis is the reference line, dependence of the chromatic difference on angles of rotation the central axis of which is the reference line can be reduced. Lighting apparatus 300 illustrated in FIG. 14 is a surface mounted device (SMD) lighting apparatus. The number of light-emitting elements 2 disposed on a principal surface of substrate 1 is one. A shape of sealing member 3b is the same as the shape of sealing member 3A.

What is claimed is:
1. A lighting apparatus comprising:
a substrate having a principal surface;
a light-emitting element disposed on the principal surface of the substrate; and
a sealing member disposed on the principal surface of the substrate and covering the light-emitting element, the sealing member containing a material that converts a wavelength of light emitted from the light-emitting element,
wherein the sealing member has a contour in a shape of a curved convex in at least one cross section that passes through a center of the light-emitting element and is perpendicular to the principal surface of the substrate, and
when a line that passes through the center of the light-emitting element and is perpendicular to the principal surface of the substrate is set as a reference line,
a point of intersection of the reference line and the principal surface of the substrate is set as a reference point,
a straight line that passes through the reference point and an arbitrary point on the contour of the sealing member is set as an arbitrary straight line,
a normal to the contour of the sealing member at the arbitrary point on the contour is set as an arbitrary normal,
an angle formed by the reference line and the arbitrary straight line is set as an observation angle, and
an angle formed by the arbitrary normal and the arbitrary straight line is set as an output angle,
the output angle is represented by an approximate expression of a quadratic or trigonometric function of the observation angle, the quadratic or trigonometric function passing through an origin.

2. The lighting apparatus according to claim 1,
wherein, when $\theta_{out}$ and $\theta_{obs}$ in the approximate expression denote the output angle and the observation angle, respectively, and $\theta_{out}(90°)$ denotes the output angle that is obtained when the observation angle is 90 degrees,
a relationship between the observation angle and the output angle is $\theta_{out}/\theta_{out}(90°)=-\cos\theta_{obs}+1$.

3. The lighting apparatus according to claim 2,
wherein a lower limit of a 95% confidence interval in the relationship between the observation angle and the output angle is $\theta_{out}/\theta_{out}(90°)=-1.03\cos\theta_{obs}+0.97$, and an upper limit of the 95% confidence interval in the relationship between the observation angle and the output angle is $\theta_{out}/\theta_{out}(90°)=-0.97\cos\theta_{obs}+1.03$.

4. The lighting apparatus according to claim 1,
wherein, further when the reference line is set as a y-axis, and a line that passes through the reference point and extends along the principal surface of the substrate is set as an x-axis,
a curved line obtained by projecting the contour of the sealing member onto an xy-plane defined by the x-axis and the y-axis is approximated by a function including a trigonometric function.

5. The lighting apparatus according to claim 4,
wherein, when normalization is applied under a condition that a point on the contour at zero on the x-axis falls on 1 on the y-axis,
a lower limit of a 95% confidence interval of the function including the trigonometric function that approximates the curved line obtained by projecting the contour of the sealing member onto the xy-plane is $y=1.20\cos x-0.28$, and an upper limit of the 95% confidence interval of the function including the trigonometric function is $y=1.31\cos x-0.20$.

6. A lighting apparatus comprising:
a substrate having a principal surface;

a light-emitting element disposed on the principal surface of the substrate; and a sealing member disposed on the principal surface of the substrate and covering the light-emitting element, the sealing member containing a material that converts a wavelength of light emitted from the light-emitting element, wherein the sealing member has a contour in a shape of a curved convex in at least one cross section that passes through a center of the light-emitting element and is perpendicular to the principal surface of the substrate, and when a line that passes through the center of the light-emitting element and is perpendicular to the principal surface of the substrate is set as a y-axis, a point of intersection of the y-axis and the principal surface of the substrate is set as a reference point, and a line that passes through the reference point and extends along the principal surface of the substrate is set as an x-axis, a curved line obtained by projecting the contour of the sealing member onto an xy-plane defined by the x-axis and the y-axis is approximated by a function including a trigonometric function.

7. The lighting apparatus according to claim 6, wherein, when normalization is applied under a condition that a point on the contour at zero on the x-axis falls on 1 on the y-axis, a lower limit of a 95% confidence interval of the function including the trigonometric function that approximates the curved line obtained by projecting the contour of the sealing member onto the xy-plane is $y=1.20 \cos x-0.28$, and an upper limit of the 95% confidence interval of the function including the trigonometric function is $y=1.31 \cos x-0.20$.

* * * * *